United States Patent [19]

Sakai

[11] Patent Number: 4,907,058
[45] Date of Patent: Mar. 6, 1990

[54] COMPLEMENTARY SEMICONDUCTOR DEVICE HAVING A DOUBLE WELL

[75] Inventor: Yoshio Sakai, Tsukui, Japan

[73] Assignee: Hitachi, Ltd., Tokyo, Japan

[21] Appl. No.: 214,674

[22] Filed: Jul. 1, 1988

[30] Foreign Application Priority Data

Jul. 3, 1987 [JP] Japan .................. 62-165177

[51] Int. Cl.⁴ ............................................ H01L 29/78
[52] U.S. Cl. ........................................ 357/42; 357/48; 357/50; 357/23.6; 357/45
[58] Field of Search .................... 357/42, 48, 50, 23.6, 357/45

[56] References Cited

U.S. PATENT DOCUMENTS

| | | | |
|---|---|---|---|
| 4,578,128 | 3/1986 | Mundt | 357/50 |
| 4,684,971 | 8/1987 | Payne | 357/42 |
| 4,717,686 | 1/1988 | Jacobs | 357/42 |

FOREIGN PATENT DOCUMENTS 627701 2/1987 Japan .

*Primary Examiner*—Andrew J. James
*Assistant Examiner*—David Soltz
*Attorney, Agent, or Firm*—Kenyon & Kenyon

[57] ABSTRACT

A CMOSLSI is disclosed which includes a semiconductor body, a first N-well region formed in the semiconductor body, a second N-well region, a greater part of which is formed in the first N-well region, a first P-well region formed in the semi-conductor body, a second P-well region, a greater part of which is formed in the first P-well region, a P-channel MOS transistor formed in the second N-well region, and an N-channel MOS transistor formed in the second P-well region, to reduce the distance between the P-channel MOS transistor and the N-channel MOS transistor, thereby increasing the packing density of the CMOSLSI.

30 Claims, 8 Drawing Sheets

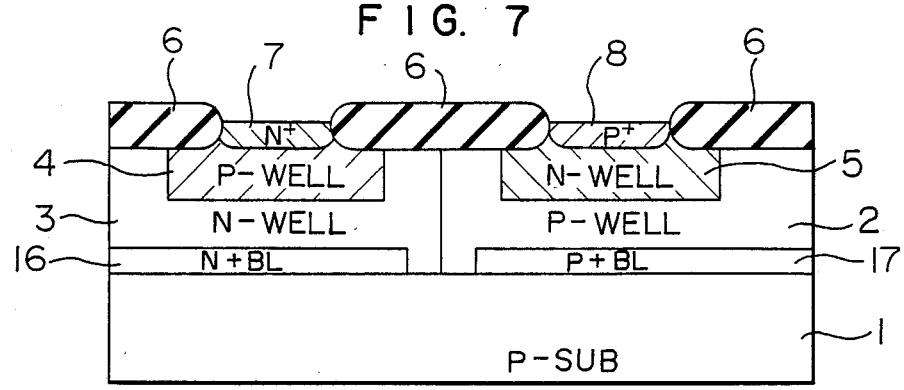
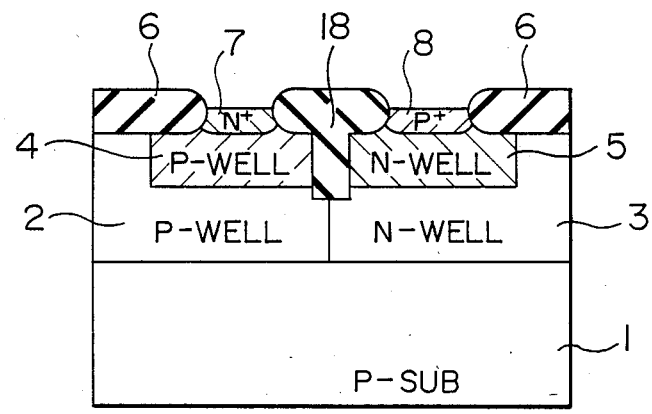
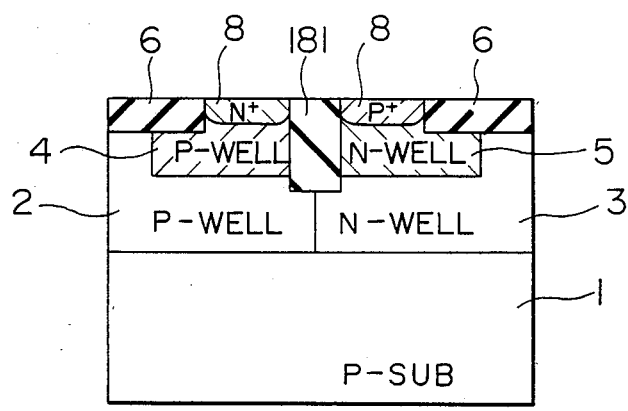

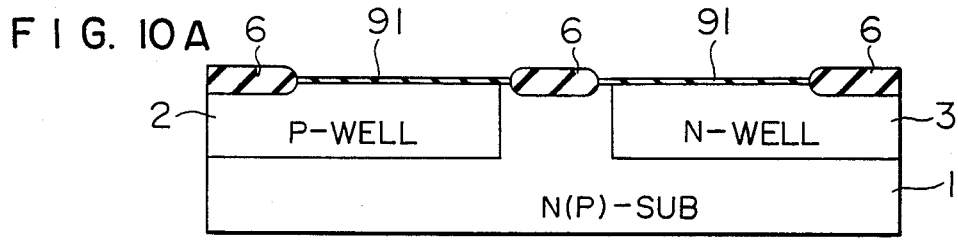
F I G. 10A
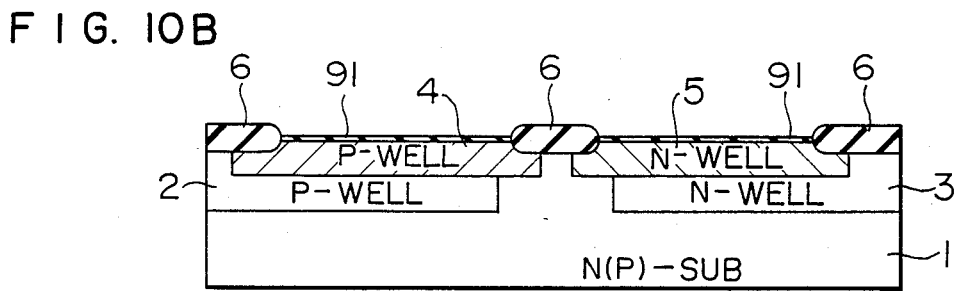
F I G. 10B
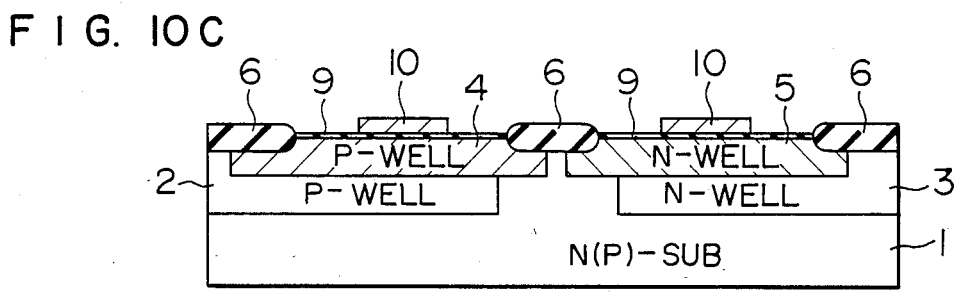
F I G. 10C
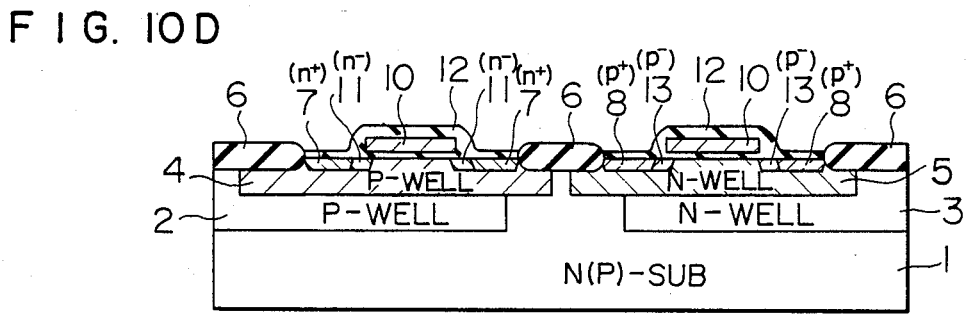
F I G. 10D
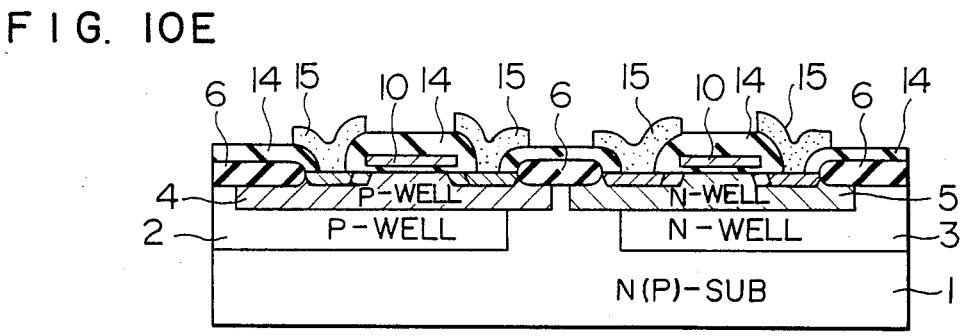
F I G. 10E

COMPLEMENTARY SEMICONDUCTOR DEVICE HAVING A DOUBLE WELL

BACKGROUND OF THE INVENTION

The present invention relates to a complementary semiconductor device (hereinafter referred to as "CMOS"), and more particularly to a CMOS, in which an isolation region between two well regions of opposite conductivity types, each including an insulated gate field effect transistor (hereinafter referred to as "MOS transistor"), is made very small in size to make possible a high-speed operation and large scale integration.

A CMOS is low in power dissipation, and can operate at high speed. Accordingly, the CMOS has been widely used in a memory device and a microcomputer, in recent years. An example of the CMOS is described in a Japanese patent application (Post-examination publication No. 62-7,701). The packing density of CMOS is determined by the distance between an N-channel MOS transistor and a P-channel MOS transistor (that is, the sum of $d_n$ and $d_p$ shown in FIG. 1). In order to increase the packing density of CMOS, it is necessary to make the isolation distance at the boundary between two well regions as small as possible.

In a conventional device shown in FIG. 1, in order to prevent the punch through and short channel effect of a parasitic MOS transistor which is formed between a highly-doped N-diffusion layer 7 serving as the source and drain regions of an N-channel MOS transistor and an N-well region 3, it is required to make a distance $d_n$ between the highly-doped N-diffusion layer 7 and one end of a P-well region 2 larger than variations in position of the above end of the P-well region 2 due to the misregistration of mask in a photolithographic process, that is, it is necessary to make the distance $d_n$ larger than several micrometers. Similarly, it is necessary to make large a distance $d_p$ between a highly-doped P-diffusion layer 8 and a P-well region 2. Thus, it is required to make the distance between the N-channel MOS transistor and a P-channel MOS transistor greater than about 5 μm, which makes it difficult to increase the packing density of CMOS. In order to solve this problem, it has been tried to dig a trench at the boundary between the P-well region 2 and the N-well region 3 so that the depth of the trench is greater than the depth of the well regions 2 and 3. However, it is difficult to form a deep trench in a semiconductor body, and moreover crystal defects are generated by the formation of the deep trench. Hence, it has not been put to practical use to dig a deep trench at the boundary between adjacent well regions.

SUMMARY OF THE INVENTION

It is an object of the present invention to provide a CMOS which is very high in packing density.

In order to attain the above object, according to the present invention, there is provided a CMOS having a double well structure, in which a shallow P-well region is formed in a surface portion of a deep P-well region formed in the surface of a semiconductor substrate, by the diffusion of an impurity from a window in an insulating film for element separation, a shallow N-well region is formed in a surface portion of a deep N-well region formed in the surface of the semiconductor substrate, by the diffusion of an impurity from another window in the insulating film for element separation, and highly-doped N and P-diffusion layers each serving as the source and drain regions of MOS transistor are formed in the shallow P- and N-well regions, respectively, by doping each of the shallow well regions with an impurity from the window in the insulating film for element separation.

In more detail, according to an aspect of the present invention, a CMOS which includes a MOS transistor of a second conductivity type having a first deep well region of a first conductivity type formed in the surface of a semiconductor substrate and a MOS transistor of the first conductivity type having a second deep well region of the second conductivity type formed in the surface of the semiconductor substrate, has the following structure. That is, a third well region of the second conductivity smaller in depth than the second well region, is formed in the semiconductor substrate by the diffusion of an impurity from a surface area of the second well region defined by that window in an insulating film for element separation which is formed on the second well region, and a highly-doped diffusion layer of the first conductivity type smaller in depth than the third well region is formed in the third well region by doping the third well region with an impurity from the window on the second well region, to be used as the source and drain regions of the MOS transistor of the first conductivity type. Further, a fourth well region of the first conductivity type, smaller in depth than the first well region, is formed in the semiconductor substrate by the diffusion of an impurity from a surface area of the first well region defined by that window in the insulating film for element separation which is formed on the first well region, and a highly-doped diffusion layer of the second conductivity type, smaller in depth than the fourth well region, is formed in the fourth well region by doping the fourth well region with an impurity from the window on the first well region, to be used as the source and drain regions of the MOS transistor of the second conductivity type.

According to another aspect of the present invention, an insulating film is formed at the boundary between the third well region and the fourth well region so that the depth of the insulating film is smaller than the depth of each of the first and second well regions and larger than the depth of each of third and fourth well regions, for the purpose of isolation.

According to a further aspect of the present invention, a vertical bi-polar transistor using one of the third and fourth well regions as a base region is formed in a CMOS, to be used as one circuit element thereof.

As mentioned above, according to the present invention, a shallow well region is formed by diffusing an impurity from a window in an insulating film for element separation into a semiconductor substrate, and a highly-doped diffusion layer is formed in the shallow well region by doping the shallow well region with an impurity from the above-mentioned window, to be used as the source and drain regions of MOS transistor. That is, the positional relation between the shallow well region and the highly-doped diffusion layer (that is, source/drain region) is not determined by a mask used in a photolithographic process, but self-alignment technology is used for the formation of the shallow well region and the source/drain region. Thus, the distance between the shallow well region and the source/drain region can be made small so long as a desired breakdown voltage is maintained. That is, the distance between an N-channel MOS transistor and a P-channel MOS transistor can be reduced, and thus the packing density of CMOS can be increased in a great degree.

As mentioned above, according to the present invention, an area necessary for isolating an N-channel region and a P-channel region from each other can be reduced by using a simple, easy manufacturing process, and thus the packing density of a CMOS can be increased.

These and other objects and many of the attendant advantages of the present invention will be readily appreciated as the same becomes better understood by reference to the following detailed description when considered in connection with the accompanying drawings.

BRIEF DESCRIPTION OF THE DRAWINGS

FIGS. 6 and 7 are views showing cross sections of CMOS's according to a third embodiment of the present invention.

FIGS. 8 and 9 are views showing cross sections of CMOS's according to a fourth embodiment of the present invention.

FIGS. 10A to 10E are views showing a manufacturing process of CMOS according to fifth embodiment of the present invention.

DESCRIPTION OF THE PREFERRED EMBODIMENTS

Various embodiments of the present invention will be explained below in detail, with reference to the drawings.

EMBODIMENT I

Figure 1:
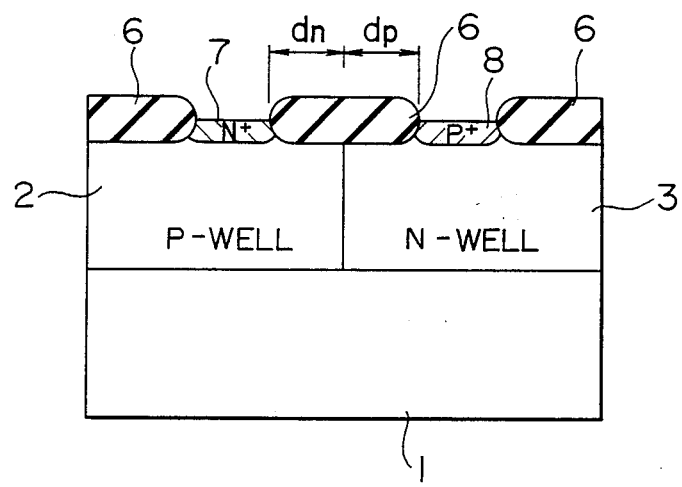
FIG. 1 is a view showing a cross section of a conventional CMOS.
Figure 2A:
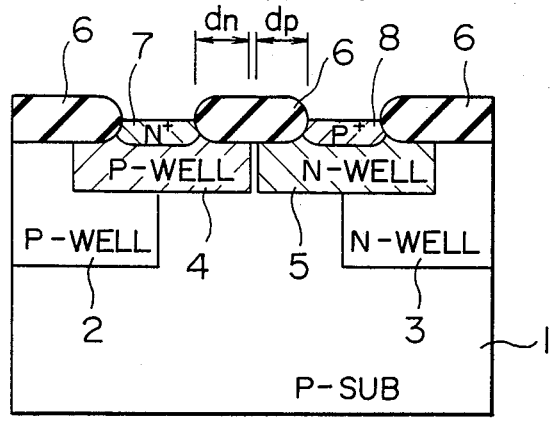
FIG. 2A is a view showing a cross section of a CMOS according to a first embodiment of the present invention.

FIG. 2A shows a cross section of a CMOS according to a first embodiment of the present invention Unlike the conventional CMOS of FIG. 1, the CMOS of FIG. 2A has a deep P-well region 2 and a deep N-well region 3 which are spaced apart from each other at the boundary between an N-channel region and a P-channel region. Incidentally, each of the P-well region 2 and the N-well region 3 has a depth of 3 to 5 $\mu$m. Further, a shallow P-well region 4 and a shallow N-well region 5 which are the characteristic feature of a CMOS according to the present invention, are formed by diffusing a dopant given from each of windows in an insulating SiO$_2$ film 6, which is a field oxidation film and is used as a mask in forming a highly-doped N-diffusion layer (namely, N$^+$-diffusion layer) 7 and a highly-doped P-diffusion layer (namely, P$^+$-diffusion layer) 8. That is, self-alignment technology is used for the formation of these regions and layers. Accordingly, a distance d$_n$ between the right end of the P-well region 4 and the right end of the N$^+$-diffusion layer 7 and a distance d$_p$ between the left end of the N-well region 5 and the left end of the P$^+$-diffusion layer 8 are both determined on the basis of the self-alignment technology. Accordingly, when each of the shallow well regions 4 and 5 has an optimum impurity concentration, for example, an impurity concentration of about 10$^{17}$ atoms per cm$^3$ so as not to generate the punch through of a parasitic MOS transistor, the distance between the N$^+$-diffusion layer 7 and the P$^+$-diffusion layer 8 can be reduced to a value of 1 to 2 $\mu$m. In this case, a silicon substrate 1 may be made of N-silicon or P-silicon.

Figure 2B:
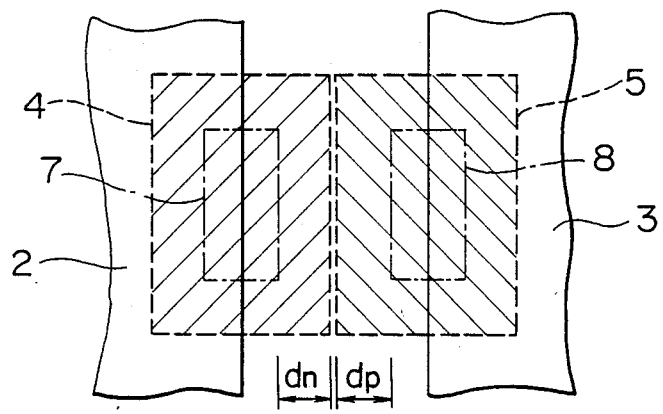
FIG. 2B is a plan view of the CMOS shown in FIG. 2A.

FIG. 2B is a planview of a CMOS shown in FIG. 2A. Referring to FIG. 2B, each of the shallow P-well region 4, the shallow N-well region 5, the N$^+$-diffusion layer 7 and the P$^+$-diffusion layer 8 has the form of an isolated island. Further, the shallow P-well region 4 and the shallow N-well region 5 isolated from each other are electrically connected to the deep P-well region 2 and the deep N-well region 3, respectively. Accordingly, the electric potentials of the shallow well regions 4 and 5 are determined by the deep well regions 2 and 3, respectively. Thus, when a N-channel MOS transistor and a P-channel MOS transistor are formed in the shallow P-well region 4 and the shallow N-well region 5, respectively, a CMOS including these MOS transistors can show stable device characteristics.

EMBODIMENT II

Figure 3:
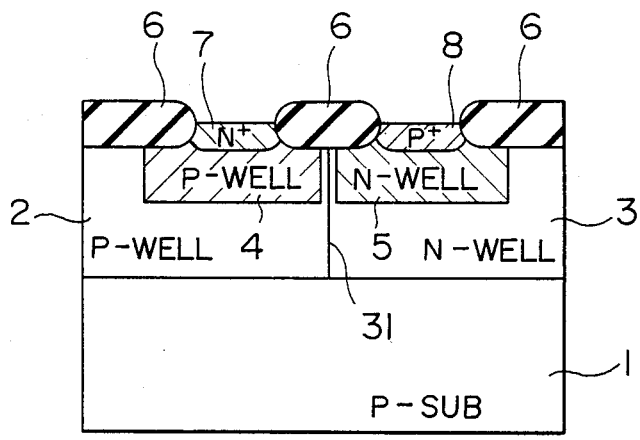
FIGS. 3, 4 and 5 are views showing cross sections of CMOS's according to a second embodiment of the present invention.

FIG. 3 shows a cross section of a CMOS according to a second embodiment of the present invention. According to the present embodiment, a deep P-well region 2 and a deep N-well region 3 are kept in contact with each other. Accordingly, the deep well regions 2 and 3 can be formed by a single photo-mask process, and self-alignment technology can be applied. Thus, the number of fabrication steps can be reduced, as compared with that in the first embodiment.

Figure 4:
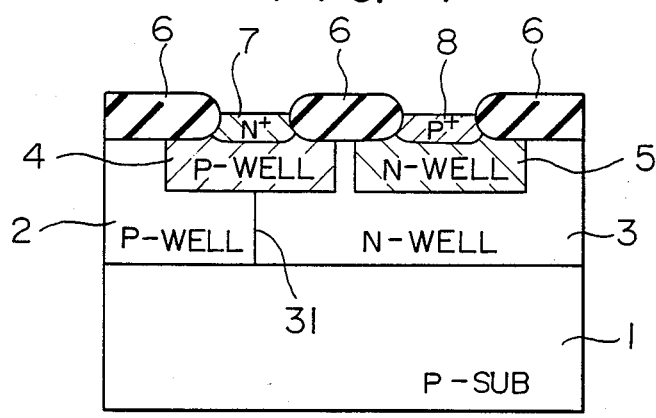
Figure 5:
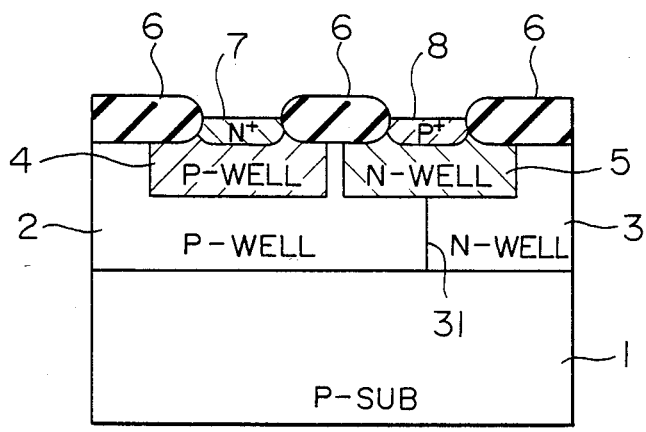

In a case where the boundary 31 between the deep P-well region 2 and the deep N-well region 3 is erroneously located in relation to the shallow well regions 4 and 5 by misalignment of mask, the structures shown in FIGS. 4 and 5 are obtained. For example, in the structure of FIG. 4, the deep N-well region 3 exists under the shallow P-well region 4. However, the N$^+$-diffusion layer 7 is electrically separated from the N-well region 3 by the shallow P-well region 4.

EMBODIMENT III

Figure 6:
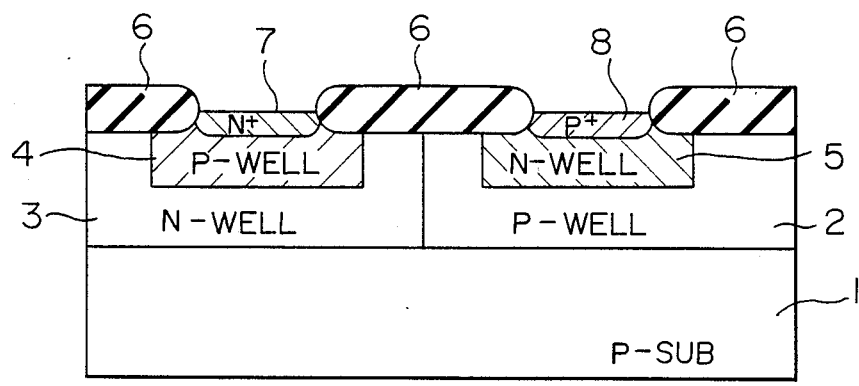

FIG. 6 shows a cross section of a CMOS according to a third embodiment of the present invention. In the semiconductor portion shown in FIG. 6, each of a shallow P-well region 4 and a shallow N-well region 5 is used as the base region of a vertical bi-polar transistor, and each of a deep P-well region 2 and a deep N-well region 3 is used as the collector region of the bi-polar transistor. Hence, the deep N-well region 3 lies under the shallow P-well region 4, and the deep P-well region 2 lies under the shallow N-well region 5. Thus, vertical bi-polar transistors can be formed by a process similar to a CMOS fabricating process. When the bi-polar transistors thus obtained are included in a CMOS circuit, the operation speed and other performance characteristics of the CMOS circuit can be greatly improved without increasing a manufacturing cost. Further, as shown in FIG. 7, a highly-doped N-buried layer 16 and a highly-doped P-buried layer 17 may be formed at the bottoms of the deep N-well region 3 and the deep P-well region 2, respectively, to reduce the collector resistance of each vertical bi-polar transistor, thereby improving the characteristics of the bi-polar transistor.

EMBODIMENT IV

FIGS. 8 and 9 show cross sections of CMOS's according to a fourth embodiment of the present invention. In the first to third embodiments, a field oxidation film is formed by the local oxidation of silicon. Accordingly, it is difficult to make the distance between the N+-diffusion layer 7 and the P+-diffusion layer 8 smaller than 1 μm without degrading isolation characteristics. In the present embodiment, an insulating film is inserted between a shallow P-well region 4 and a shallow N-well region 5, that is, a trench isolation structure is formed. Thus, the distance between an N+-diffusion layer 7 and a P+-diffusion 8 can be made smaller than 1 μm, without producing a parasitic MOS effect and a parasitic thyristor effect. The structure shown in FIG. 8 includes both an insulating $SiO_2$ film 6 formed by the local silicon oxidation method and a trench isolation $SiO_2$ film 18. In this structure, each of the N+-diffusion layer 7 and the P+-diffusion layer 8 is spaced apart from the trench isolation $SiO_2$ film 18 a distance of 0.2 to 0.5 μm by the lateral elongation of the insulating $SiO_2$ film 6 (that is, bird's beak). While, in the structure shown in FIG. 9, the surface of a trench isolation $SiO_2$ film 181 is exposed, and the N+-diffusion layer 7 and the P+-diffusion layer 8 are kept in contact with the trench isolation $SiO_2$ film 181. Hence, the distance between the N+-diffusion layer 7 and the P+-diffusion layer 8 can be made smaller than that shown in FIG. 8. In the structures of FIGS. 8 and 9, in order to prevent the generation of crystal defect and to make the manufacturing process easy, it is desirable to make small the depth of each of the trench isolation $SiO_2$ films 18 and 181. That is, the trench isolation films 18 and 181 are made smaller in depth than a deep P-well region 2 and a deep N-well region 3. When the depth of the trench isolation films 18 and 181 is made greater than the depth of the shallow P-well region 4 and the shallow N-well region 5, the isolation characteristics are greatly improved. Even if the depth of the trench isolation films 18 and 181 is made only a little smaller than the depth of the shallow well regions 4 and 5, the structures of FIGS. 8 and 9 will be superior in isolation characteristics to a CMOS structure which does not include a trench isolation $SiO_2$ film.

EMBODIMENT V

FIGS. 10A to 10E show a fabrication process of a CMOS which is shown in FIG. 2A and has been explained in the EMBODIMENT I.

At first, a P-well region 2 and an N-well region 3 each having an impurity concentration of $10^{15}$ to $10^{16}$ atoms per cm$^3$ and a depth of 3 to 5 μm are formed in a surface portion of an N- or P-silicon substrate 1 through ion implantation techniques and thermal diffusion techniques. Then, an insulating $SiO_2$ film 6 which is a field oxidation film and has a thickness of 0.2 to 1.0 μm, is formed by the local oxidation method, as shown in FIG. 10A. Next, a P-type impurity and an N-type impurity are implanted from windows in the insulating $SiO_2$ film 6 into the silicon substrate 1 through an insulating $SiO_2$ film 91 having a thickness of 10 to 20 nm, and the impurity-doped regions thus obtained are extended by thermal diffusion techniques to form a shallow P-well region 4 and a shallow N-well region 5 each having a depth of 0.5 to 1.5 μm and an impurity concentration of $5 \times 10^{16}$ to $10^{18}$ atoms per cm$^3$, as shown in FIG. 10B. Then, as shown in FIG. 10C, a gate insulating film 9 (made of $SiO_2$ and having a thickness of 10 to 100 nm) and a gate electrode 10 (formed of a polysilicon film, a silicide film, or a composite film including polysilicon and silicide films) are provided in accordance with a conventional MOS-device fabrication process. Thereafter, as shown in FIG. 10D, a low-doped N-diffusion layer 11 and a low-doped P-diffusion layer 13 each having an impurity concentration of about $10^{12}$ to $10^{14}$ atoms per cm$^3$ are formed through ion implantation techniques, and then an insulating film 12 for covering the gate electrode, an N+-diffusion layer 7 and a P+-diffusion layer 8 are formed. Finally, as shown in FIG. 10E, a surface protecting film 14, contact holes and a wiring pattern 15 are formed.

EMBODIMENT VI

Figure 11A:
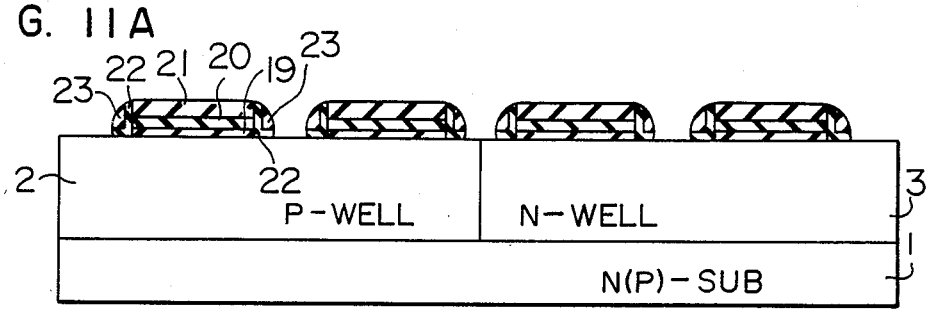
FIGS. 11A to 11E are views showing a manufacturing process of CMOS according to a sixth embodiment of the present invention.
Figure 11B:
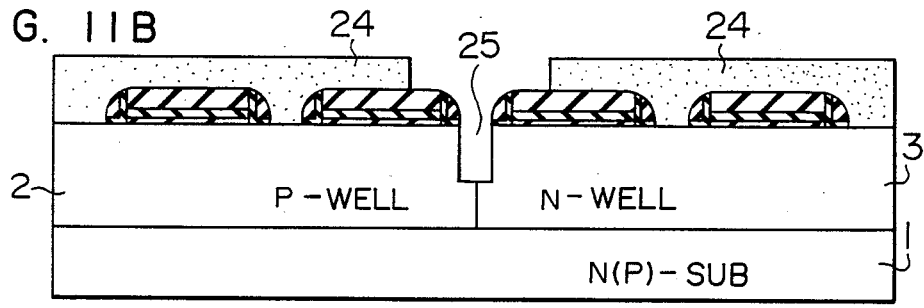
Figure 11C:
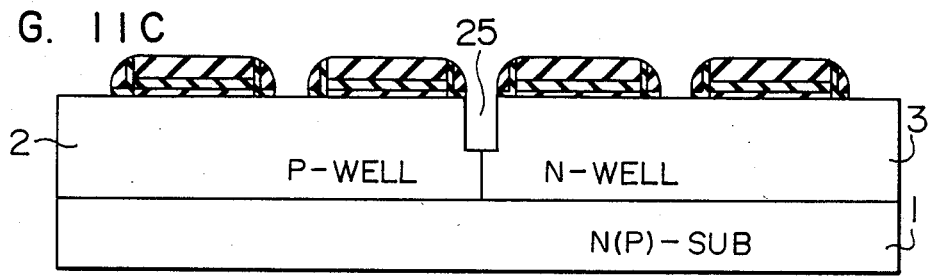
Figure 11D:
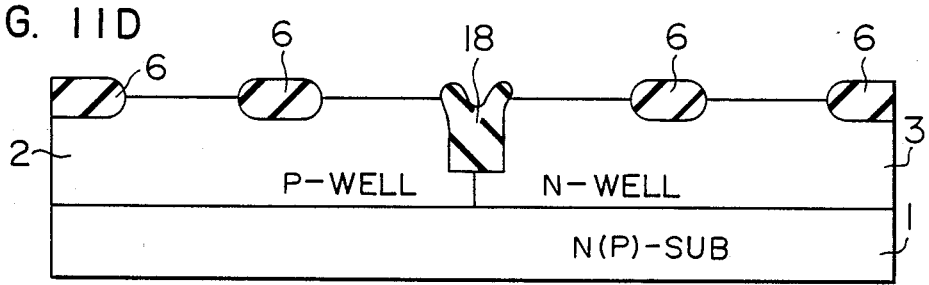
Figure 11E:
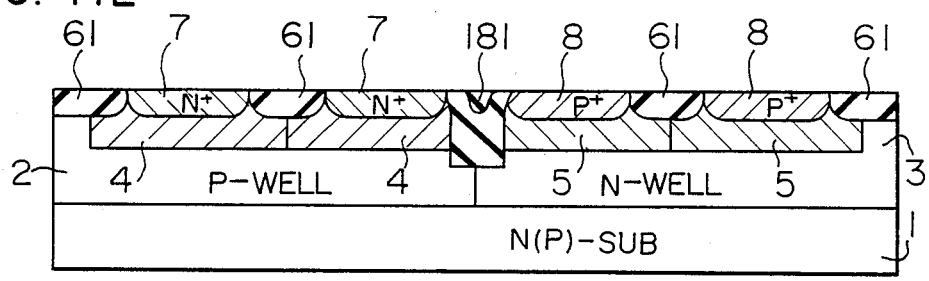

FIGS. 11A to 11E show a fabrication process of a CMOS which is shown in FIG. 9 and has been explained in the EMBODIMENT IV. As shown in FIG. 11A, a deep P-well region 2 and a deep N-well region 3 are formed in a surface portion of an N- or P-silicon substrate 1 through ion implantation techniques and thermal diffusion techniques, and then an island pattern including a 10 to 100-nm thick $SiO_2$ film 19, a 50 to 200-nm thick $Si_3N_4$ film 20 and a 100 to 300-nm thick $SiO_2$ film 21 is formed on the well regions 2 and 3. Further, a 10 to 50-nm thick $Si_3N_4$ film 22 and a 100 to 300-nm thick $SiO_2$ film 23 are formed on the side wall of each island, and then the whole surface is etched back to form side-wall spacers. Next, as shown in FIG. 11B, the whole surface except a surface area where the boundary between shallow well regions will be formed, is coated with a photoresist film 24, and a shallow trench 25 having a depth of about 0.5 to 2 μm is formed in the silicon substrate 1 through dry etching techniques. Next, as shown in FIG. 11C, the photo-resist film 24 is removed. Then, the exposed silicon surface is oxidized, to form an insulating $SiO_2$ film 6 having a thickness of 0.5 to 1.0 μm and a trench isolation $SiO_2$ film 18, as shown in FIG. 11D. At this time, the shallow trench 25 is incompletely filled with the $SiO_2$ film. Hence, an $SiO_2$ film is further deposited to a thickness of about 0.5 to 1.0 μm by the chemical vapor deposition method and then the whole surface area is etched back through dry etching techniques, to fill the shallow trench 25 with the trench isolation $SiO_2$ film 181 and to make flat the surface of the silicon substrate. Thereafter, as shown in FIG. 11E, the shallow P-well region 4, the shallow N-well region 5, the N+-diffusion layer 7 and the P+-diffusion layer 8 are formed in a surface area which does not have the field $SiO_2$ film 61 and the trench isolation $SiO_2$ film 180, by ion implantation techniques and heat treatment.

Figure 12:
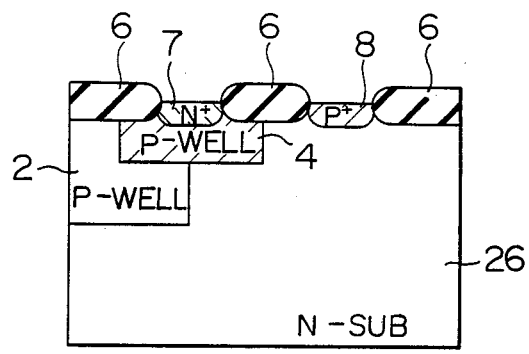
FIGS. 12, 13 and 14 are views showing cross sections of CMOS's according to an additional embodiment of the present invention.
Figure 13:
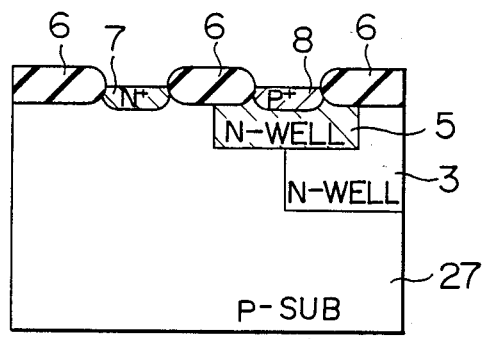

The present invention is not limited to the devices and fabrication methods mentioned in the EMBODIMENTS I to VI, but various changes may be made without departing from the fundamental technical thought of the present invention. For example, in these EMBODIMENTS, both a deep well region and a shallow well region are formed for each of an N-channel region and a P-channel region. However, a structure shown in FIG. 12 may be formed, in which a deep P-well region 2 and a shallow P-well region 4 are formed on the N-channel side, but a P-channel is formed directly on an N-silicon substrate 26 without having any well region under the P-channel. Alternatively, a structure shown in FIG. 13 may be formed, in which a deep N-well region 3 and a shallow N-well region 5 are formed on the P-channel side, but an N-channel is formed directly on a P-silicon substrate 27 without having any well region under the N-channel.

Figure 14:
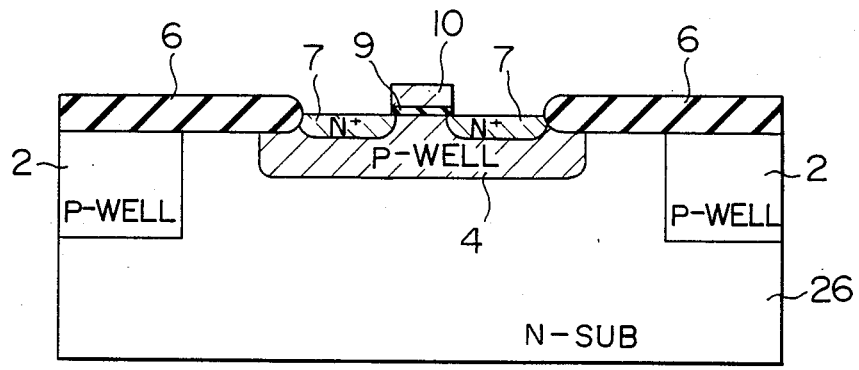

Further, in a case where a CMOS is formed on an N-silicon substrate, as shown in FIG. 14, it is possible to form an N-channel MOS transistor in a shallow P-well region 4 according to the present invention without forming a deep P-well region 2 under the shallow P-well region 4 and to put the shallow P-well region 4 in an electrical floating state. The MOS transistor thus formed is not affected by the substrate.

EMBODIMENT VII

Figure 15:
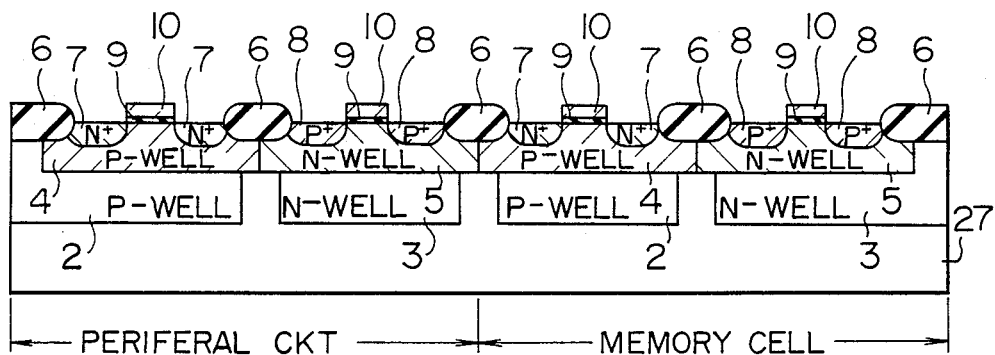
FIGS. 15, 16 and 17 are views showing cross sections of semiconductor memories which includes a CMOS according to the present invention.
Figure 16:
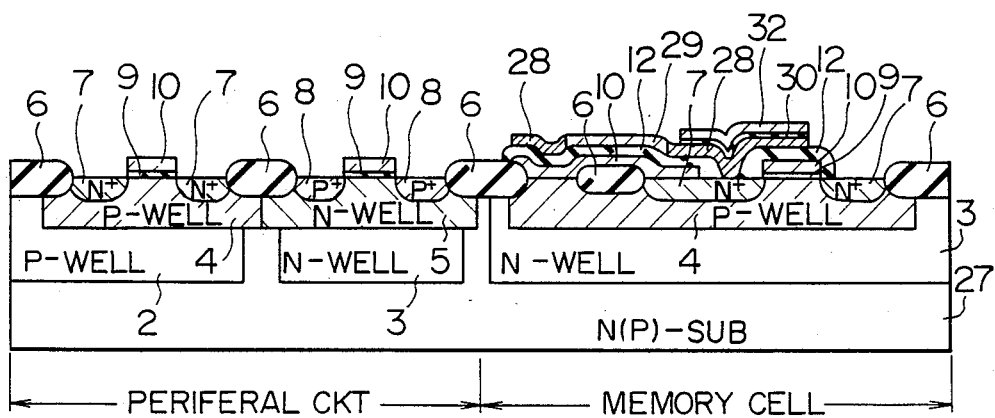
Figure 17:
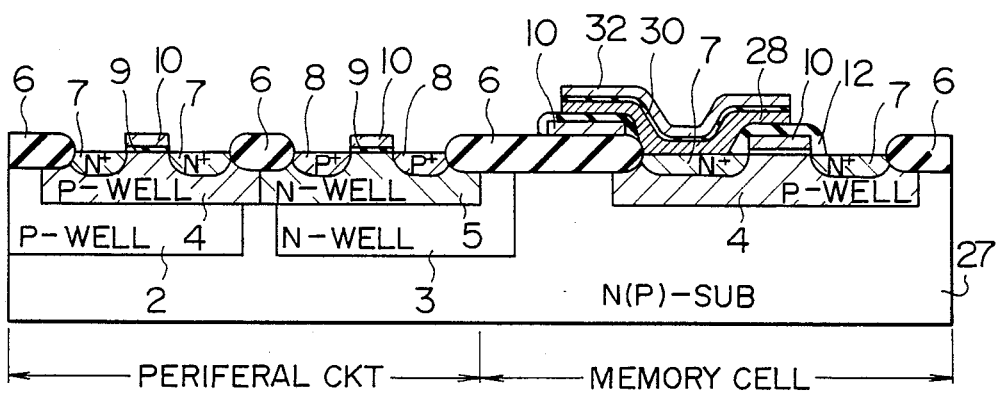

FIGS. 15, 16 and 17 show cross sections of devices according to the seventh embodiment of the present invention. In the present embodiment, a CMOS having a twin double well structure according to the present invention is included in a MOS memory.

FIG. 15 shows a cross section of a static memory of the complete CMOS type using 6 MOS transistors, and includes a memory cell and a periferal circuit. As mentioned above, the memory of FIG. 15 is of the complete CMOS type. Hence, in order to make small the area of a memory cell, thereby increasing the packing density of the memory, it is required to make small the distance between an N-channel MOS transistor and a P-channel MOS transistor. The memory of FIG. 15 has a twin double well structure according to the present invention (namely, twin double well structure made up of the deep P-well region 2, the deep N-well region 3, the shallow P-well region 4 and the shallow N-well region 5), to satisfy the above requirement.

FIG. 16 shows a cross section of a static memory, in which the load connected to a memory cell is made of high-resistance polysilicon, and includes a peripheral circuit and a memory cell. Referring to FIG. 16, the memory cell is formed in a shallow P-well region 4, which is formed in a deep N-well region 3. The N-well region 3 is applied with a source potential, an earth potential, or an intermediate potential between the source potential and the earth potential, to prevent carriers (namely, electron and positive hole) originated by external noise from flowing into the shallow P-well region 4. In the memory cell of FIG. 16, an N+-polysilicon layer 28 is formed at both ends of a high-resistance polysilicon layer 29 which serves as a load element. Further, an insulating film 30 having a thickness of 5 to 100 nm (for example, a composite film including a $SiO_2$ film and a $Si_3N_4$ film) is formed on the N+-polysilicon layer 28 connected to the high-resistance polysilicon layer 29, and an N+-polysilicon layer 32 is formed on the insulating film 30 to form a stacked capacitor, thereby producing high soft error immunity. The peripheral circuit of this static memory is formed of a CMOS having a twin double well structure according to the present invention.

FIG. 17 shows a cross section of a dynamic memory using a memory cell of the stacked capacitor type, and includes a memory cell and a peripheral circuit. Referring to FIG. 17, the memory cell is formed in a shallow P-well region 4, so as to be scarcely affected by an α particle and electrical noise charge. As shown in FIG. 17, a stacked capacitor made up of a lower N+-polysilicon layer 28, a thin insulating film 30 and an upper N+-polysilicon layer 32 for storing information (that is, a capacitor having a capacitor electrode 28 and a capacitor plate 32) is extended to a word line (namely, a gate electrode) 10 which is provided on an element separating region 6. The peripheral circuit of this dynamic memory is also formed of a CMOS having a twin double well structure according to the present invention.

In recent years, the size of a memory cell has been made very small to increase the packing density of a memory device. Accordingly, it is required to increase the packing density of a CMOS for forming a peripheral circuit connected directly to memory cells. The present invention can satisfy the above technical requirements, and thus can exhibit a remarkable effect on a microcomputer and a logic apparatus which include a memory device.

As has been explained above in detail, according to the present invention, a highly-doped diffusion layer and a shallow well region are formed through self-alignment techniques, and thus the distance between N- and P-channel regions of a CMOS can be reduced to one-tenth a conventional value. Hence, the packing density of the CMOS can be increased. Further, according to the present invention an area for isolation is reduced. Hence, parasitic capacitance such as wiring capacitance can be reduced, and thus the performance characteristics of the CMOS such as the operation speed thereof can be improved.

It is further understood by those skilled in the art that the foregoing description is preferred embodiments of the disclosed device and that various changes and modifications may be made in the present invention without departing from the spirit and scope thereof.

For example, though the device of the present invention is made by diffusion method in the foregoing description, the device of the present invention can be made by implantation method.

I claim:

1. A complementary semiconductor device including an insulated gate field effect transistor of a second conductivity type having a first deep well region of a first conductivity type formed in the surface of a semiconductor substrate and an insulated gate effect transistor of the first conductivity type having a second deep well region of the first conductivity type formed in the surface of the semiconductor substrate, wherein a third well region of the second conductivity type, smaller in depth than the second well region, is formed in the semiconductor substrate by the doping of an impurity from a surface area of the second well region defined by a window in one part of an insulating film for element separation which is also used for doping of a highly doped layer having a second conductivity type, and the highly-doped diffusion layer of the first conductivity type, smaller in depth than the third well region, is formed in the third well region by doping in the third well region with an impurity from the window on the second well region, said highly doped layer of the first conductivity type to be used as the source and drain regions of the insulated gate field effect transistor of the first conductivity type, and wherein a fourth well region of the first conductivity type, smaller in depth than the first well region, is formed in the semiconductor substrate by the doping of an impurity from a surface area of the first well region defined by a window in another part of the insulating film for element separation which is also used for doping of a highly doped layer of a second conductivity type, and the highly-doped diffusion layer of the second conductivity type, smaller in depth than the fourth well region, is formed in the fourth well region with an impurity from the window on the first well region, said highly doped layer of the second conductivity type to be used as the source and drain regions of the insulated gate field effect transistor of the second conductivity type, and a vertical bi-polar transistor having a base region formed from one of the third and fourth well regions is a circuit element.

2. A complementary semiconductor device according to claim 1, wherein in insulating film, smaller in depth than the first and second well regions and greater in depth than the third and fourth well regions, is formed in a boundary region between the third well region and the fourth well region.

3. A complementary semiconductor device as claimed in claim 1, further comprising a microcomputer that is connected to the semiconductor device.

4. A semiconductor memory comprising:
a semiconductor body;
a first N-well region formed in the semiconductor body;
a second N-well region, a greater part of which is formed in the first N-well region, and wherein the second N-well region is defined by a window in one part of an insulating film for element separation which is also used for doping of a highly doped layer of P-type conductivity;
a first P-well region formed in the semiconductor body;
a second P-well region, a greater part of which is formed in the first P-well region, and wherein the second P-well region is defined by a window in another part of the insulating film for element separation which is also used for doping of a highly doped layer having N-type conductivity;
a P-channel MOS transistor formed in the second N-well region;
an N-channel MOS transistor formed in the second P-well region; and
a memory cell formed in the semiconductor body in a third P-well region formed in the semiconductor body, the third P-well region having the same depth as the second P-well region.

5. A semiconductor memory according to claim 4, wherein the second N-well region and the second P-well region are kept in contact with each other.

6. A semiconductor memory according to claim 5, wherein the first N-well region and the first P-well region are kept in contact with each other.

7. A semiconductor memory as claimed in claim 4, further comprising a microcomputer that is connected to the semiconductor memory.

8. A semiconductor memory according to claim 4, wherein the third P-well region is formed in a third N-well region, and the third N-well region and the first N-well region have the same depth.

9. A semiconductor memory according to claim 8, wherein the third N-well region is applied with one of a source potential, an earth potential and an intermediate potential between the source potential and the earth potential.

10. A semiconductor memory according to claim 9, wherein the third N-well region prevents electrons and a positive hole originated by external noise from flowing into the third P-well region.

11. A semiconductor memory according to claim 4, wherein the semiconductor memory is a static memory, and the memory cell is provided with a load element formed on an insulating film which is formed on the semiconductor body.

12. A semiconductor memory according to claim 4, wherein the memory cell is provided with a capacitor having a capacitor electrode which is extended to the surface of an insulating film for element separation, to form a dynamic memory of the stacked capacitor type.

13. A semiconductor device comprising:
a semiconductor body;
a first N-well region formed in the semiconductor body;
a second N-well region, a greater part of which is formed in the first N-well region and wherein the second N-well region is defined by a window in one part of an insulating film for element separation which is also used for doping of a highly doped layer of P-type conductivity;
a P-channel MOS transistor formed in the second N-well region;
an N-channel MOS transistor formed in the second P-well region;
an isolation region formed between the second N-well region and the second P-well region; and
a memory cell that forms a semiconductor memory, the memory cell being formed in a third P-well region formed in the semiconductor body, the third P-well region having the same depth as the second P-well region.

14. A semiconductor device according to claim 13, wherein the isolation region includes an insulating film formed by the local oxidation of silicon (LOCOS).

15. A semiconductor device as claimed in claim 13, further comprising a microcomputer that is connected to the semiconductor device.

16. A semiconductor memory according to claim 13, wherein the third P-well region is formed in a third N-well region, the third N-well region is equal in depth to the first N-well region, and the third N-well region is applied with one of a source potential, an earth potential and an intermediate potential between the source potential and the earth potential.

17. A semiconductor device according to claim 13, wherein the isolation region is constructed of a recess provided in the semiconductor body and a silicon oxide film formed in the recess.

18. A semiconductor device according to claim 16, wherein the recess is greater in depth than the second N-well region and the second P-well region.

19. A semiconductor device according to claim 13, wherein parts of confronting faces of the second N-well region and the second P-well region are kept in contact with each other.

20. A semiconductor device according to claim 14, wherein the first N-well region and the first P-well region are kept in contact with each other.

21. A semiconductor memory comprising:
a semiconductor body;
a first N-well region formed in the semiconductor body;
a second N-well region, a greater part of which is formed in the first N-well region;
a first P-well region formed in the semiconductor body;
a second P-well region, a greater part of which is formed in the first P-well region;

a P-channel MOS transistor formed in the second N-well region;

an N-channel MOS transistor formed in the second P-well region; and a memory cell formed in the semiconductor body, wherein the memory cell is formed in a third P-well region formed in the semiconductor body, and the third P-well region and the second P-well region have substantially the same depth.

22. A semiconductor memory according to claim 21, wherein the semiconductor memory is a static memory, and the memory cell is provided with a load element formed on an insulting film which is formed on the semiconductor body.

23. A semiconductor memory according to claim 21, wherein the memory cell is provided with a capacitor having a capacitor electrode which is extended to the surface of an insulating film for element separation, to form a dynamic memory of the stacked capacitor type.

24. A semiconductor memory as claimed in claim 21, further comprising a microcomputer that is connected to the semiconductor memory.

25. A semiconductor memory according to claim 21, wherein the third P-well region is formed in a third N-well region, and the third N-well region and the first N-well region have substantially the same depth.

26. A semiconductor memory according to claim 25, wherein the third N-well region is applied with one of a source potential, an earth potential and an intermediate potential between the source potential and the earth potential.

27. A semiconductor memory according to claim 26, wherein the third N-well region prevents electrons and a positive hole originated by external noise from flowing into the third P-well region.

28. A semiconductor device comprising:

a semiconductor body;

a first N-well region formed in the semiconductor body;

a second N-well region, a greater part of which is formed in the first N-well region;

a first P-well region formed in the semiconductor body;

a second P-well region, a greater part of which is formed in the first P-well region;

a P-channel MOS transistor formed in the second N-well region;

an N-channel MOS transistor formed in the second P-well region; and an isolation region formed between the second N-well region and the second P-well region, wherein the semiconductor device further comprises a memory cell to form a semiconductor memory, and wherein the memory cell is formed in a third P-well region formed in the semiconductor body, and the third P-well region is substantially equal in depth to the second P-well region.

29. A semiconductor memory according to claim 28, wherein the third P-well region is formed in a third N-well region, the third N-well region is equal in depth to the first N-well region, and the third N-well region is applied with one of a source potential, an earth potential and an intermediate potential between the source potential and the earth potential.

30. A semiconductor device as claimed in claim 28, further comprising a microcomputer that is connected to the semiconductor device.

* * * * *

UNITED STATES PATENT AND TRADEMARK OFFICE
CERTIFICATE OF CORRECTION

PATENT NO. : 4,907,058
DATED : 6 March 1990
INVENTOR(S) : Yoshio SAKAI

It is certified that error appears in the above-identified patent and that said Letters Patent is hereby corrected as shown below:

| Column | Line | Corrections |
|---|---|---|
| 1 | 16 | Change "a memory device and a microcomputer" to --memory devices and microcomputer--. |
| 2 | 15 | After "conductivity" insert --type--. |
| 3 | 53 | After "invention" insert --.--. |
| 5 | 18 | Change "$N_+$" to --$N^+$--. |
| 7 | 26 | Change "periferal" to --peripheral-- |
| 8 | 31 | After "is" insert --of--. |
| 8 | 46 | Change "first" to --second--. |
| 9 | 13 | Before "insulating" change "in" to --an--. |

Signed and Sealed this

Eighteenth Day of June, 1991

Attest:

HARRY F. MANBECK, JR.

Attesting Officer

Commissioner of Patents and Trademarks